(12) United States Patent
Chen et al.

(10) Patent No.: US 8,907,230 B2
(45) Date of Patent: Dec. 9, 2014

(54) SOLAR PHOTOVOLTAIC JUNCTION BOX ASSEMBLY

(75) Inventors: Xiaoqun Chen, Shanghai (CN); Lintao Hu, Shanghai (CN); Qingtai Ma, Shanghai (CN); Feng Wang, Shanghai (CN); Chunfu Zhou, Shanghai (CN)

(73) Assignee: Tyco Electronics (Shanghai) Co. Ltd., Shanghai (CN)

( * ) Notice: Subject to any disclaimer, the term of this patent is extended or adjusted under 35 U.S.C. 154(b) by 794 days.

(21) Appl. No.: 12/976,090

(22) Filed: Dec. 22, 2010

(65) Prior Publication Data

US 2011/0147076 A1    Jun. 23, 2011

(30) Foreign Application Priority Data

Dec. 22, 2009   (CN) .......................... 2009 1 0262279

(51) Int. Cl.
*H01R 13/46* (2006.01)
*H01R 13/52* (2006.01)
*H02G 3/16* (2006.01)
*H01L 31/048* (2014.01)

(52) U.S. Cl.
CPC ............. *H01L 31/0485* (2013.01); *Y02E 10/50* (2013.01); *H01R 13/5216* (2013.01); *H02G 3/16* (2013.01)
USPC .......................................... 174/520; 174/521

(58) Field of Classification Search
USPC ......... 174/520, 521, 522, 523, 541, 559, 560, 174/561, 562, 564, 60
See application file for complete search history.

(56) References Cited

U.S. PATENT DOCUMENTS

| 5,211,576 | A * | 5/1993 | Tonkiss et al. ................ 439/462 |
| 6,462,265 | B1 * | 10/2002 | Sasaoka et al. ............... 136/251 |
| 6,953,363 | B2 * | 10/2005 | Kameyama et al. .......... 439/404 |
| 2004/0185705 | A1 * | 9/2004 | Wu ............................... 439/459 |
| 2006/0180196 | A1 * | 8/2006 | Lares et al. ................... 136/251 |
| 2008/0020649 | A1 * | 1/2008 | Scherer et al. ................ 439/639 |
| 2008/0223599 | A1 * | 9/2008 | Shen et al. ..................... 174/58 |
| 2009/0275247 | A1 | 11/2009 | Richter et al. |

FOREIGN PATENT DOCUMENTS

CN              100555675 C      10/2009

OTHER PUBLICATIONS

Chinese Office Action, dated Jul. 24, 2012, 4 pages.

* cited by examiner

*Primary Examiner* — Tremesha S Willis
(74) *Attorney, Agent, or Firm* — Barley Snyder

(57) ABSTRACT

The invention discloses a solar photovoltaic junction box assembly having a housing having a housing body and a housing cover, a cable extending into the housing body and joined to the housing body, and an electrical connector disposed in the housing body and including at least a metal piece electrically connected to a solar cell and a terminal electrically connected to the cable, wherein a chamber for filling gel therein is formed between the terminal and the joint of the cable with the housing body. A part of the cable extending into the housing is fixed to and sealed in the housing by filling gel in the chamber, and first and second over-molded structures can further prevent the cable from being loosened relative to the housing of the junction box, and further prevent water from entering into the housing of the junction box.

17 Claims, 3 Drawing Sheets

SOLAR PHOTOVOLTAIC JUNCTION BOX ASSEMBLY

CROSS-REFERENCE TO RELATED APPLICATIONS

This application claims priority under 35 U.S.C. §119 to Chinese Patent Application No. 200910262279.X filed on Dec. 22, 2009.

FIELD OF THE INVENTION

The invention relates to a solar photovoltaic junction box assembly, and in particular, relates to a solar photovoltaic junction box assembly with reliable water-proof performance.

BACKGROUND

The primary source of clean, abundant and renewable energy is the sun. One way of utilizing solar energy is the conversion of sunlight into electricity directly using photovoltaics (PV). A solar cell, or photovoltaic cell (PV), is the device that directly converts light into electric current through the photoelectric effect. The solar cell made of semiconductors is the elementary building block of the photovoltaic technology. A number of solar cells electrically connected to each other forms a PV module. Several PV modules can be wired together to form an array. PV modules and arrays are often interconnected in series and/or parallel electrical arrangements to produce any required voltage and current combination. A junction box which allows serial as well as parallel interconnection via direct wire connect or separable connectors, is the placed where the power generated by the solar cells is collected and channelled to the outside. Junction boxes are typically used to electrically connect the PV modules and/or arrays to each other and to an electrical power distribution system. Without a junction box, a PV module and/or an array could not work properly. The junction box is one of the most important components of a solar module and its importance on module quality cannot be underestimated.

Since PV modules and/or arrays as well as junction boxes are generally mounted in a single support structure or frame on a roof, exposed to the outside and severe weather, such as rain or wind, the quality of junction boxes and demands on their manufacture are high. Up to now, there have been two important issues in the field of building a solar photovoltaic junction box assembly, one is to prevent water leaking into the junction box from outside because it may cause a short circuit, and the other is to prevent a cable joined to the junction box from being loosened because it may lead to an open circuit.

In a conventional junction box, gel is applied locally in the junction box to prevent water contacting with electrical connections at the terminals of the electrical connector, and the cable is fixed to the junction box by special fasteners, such as screws, to prevent the cable from being loosened relative to the junction box. However, using special fasteners to fix the cable in a conventional junction box causes the fixing structure of the cable to be complicated and the assembly operation difficult.

As demand for clean energy grows, the above-mentioned fastening method for such junction boxes is further desired, which raises new issues with regards to fastening construction and design. Ever greater significance and attention is given to a tight-sealed fastening of the cable to the junction box despite its sophisticated environment, prevention of water leaking and prevention of cable loosing.

SUMMARY

It is therefore an object of the invention to provide an improved solar photovoltaic junction box. In particular, it is an object of the invention to provide a solar photovoltaic junction box with a simple configuration to join a cable which prevents the cable from being loosened relative to the junction box and also prevents water from leaking into the junction box.

The solar photovoltaic junction box includes a housing having a housing body and a housing cover, a cable extending into the housing body and joined to the housing body, and an electrical connector disposed in the housing body and including at least a metal piece electrically connected to a solar cell and a terminal electrically connected to the cable, wherein a chamber for filling gel therein is formed between the terminal and a joint of the cable with the housing body.

BRIEF DESCRIPTION OF THE DRAWINGS

The present invention is illustrated in greater detail below by exemplary embodiments with reference to the attached drawings, in which.

DETAILED DESCRIPTION OF THE EMBODIMENT(S)

Figure 1:
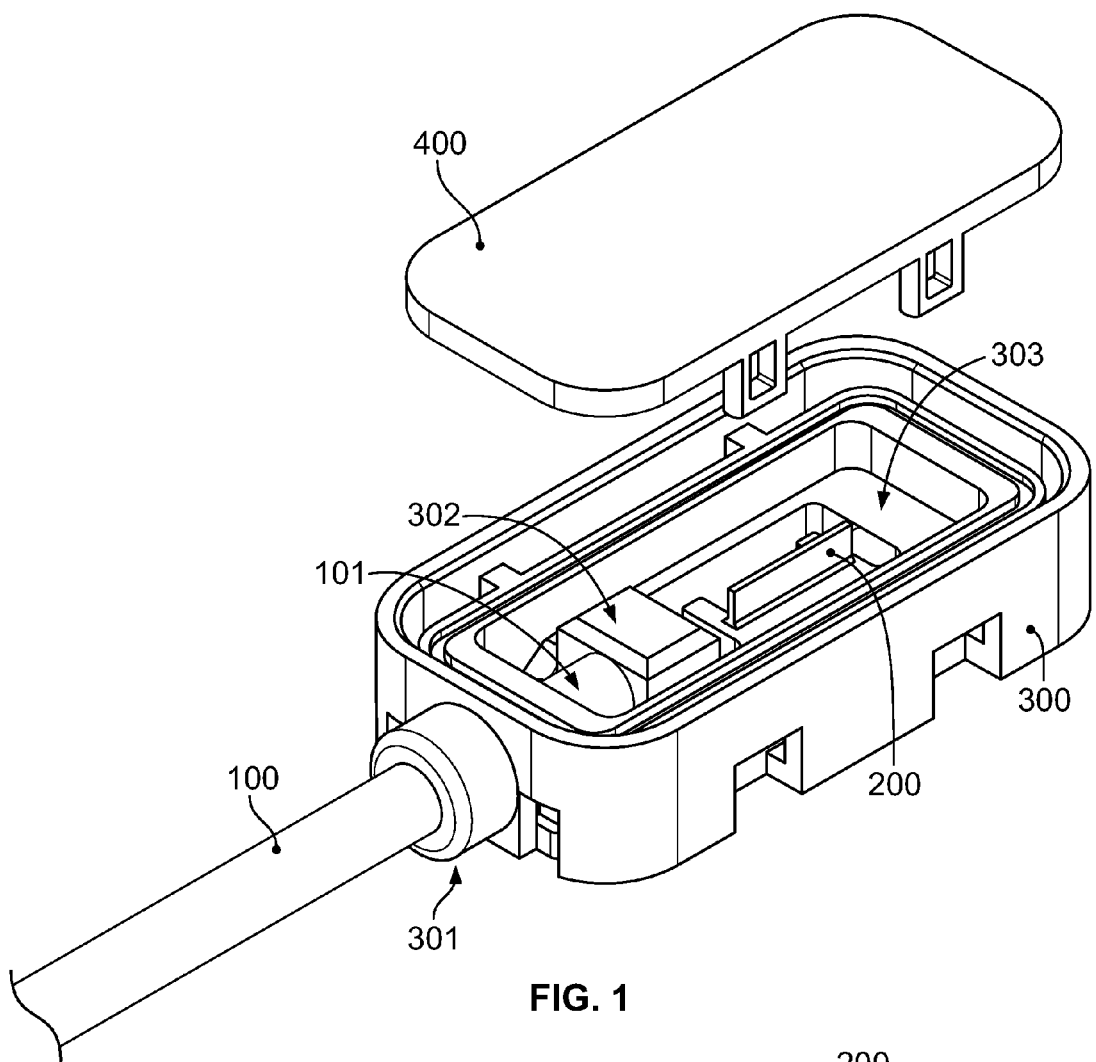
FIG. 1 is a perspective view of a solar photovoltaic junction box assembly from a side of the junction box assembly according to the invention.

The invention is explained in greater detail below with reference to the drawings, wherein like reference numerals refer to the like elements. The invention may, however, be embodied in many different forms and should not be construed as being limited to the embodiments set forth herein; rather, these embodiments are provided so that the description will be thorough and complete, and will fully convey the concept of the invention to those skilled in the art.

The discussion below relates to a side of the junction box assembly and a forward side of a ring clamp. In this case, side is intended to mean a portion on the solar photovoltaic junction box assembly which is longer than other portions of the solar photovoltaic junction box assembly, and forward side is intended to mean a portion of the ring clamp that firstly goes into the junction box when a cable is inserted into the junction box.

Figure 3:
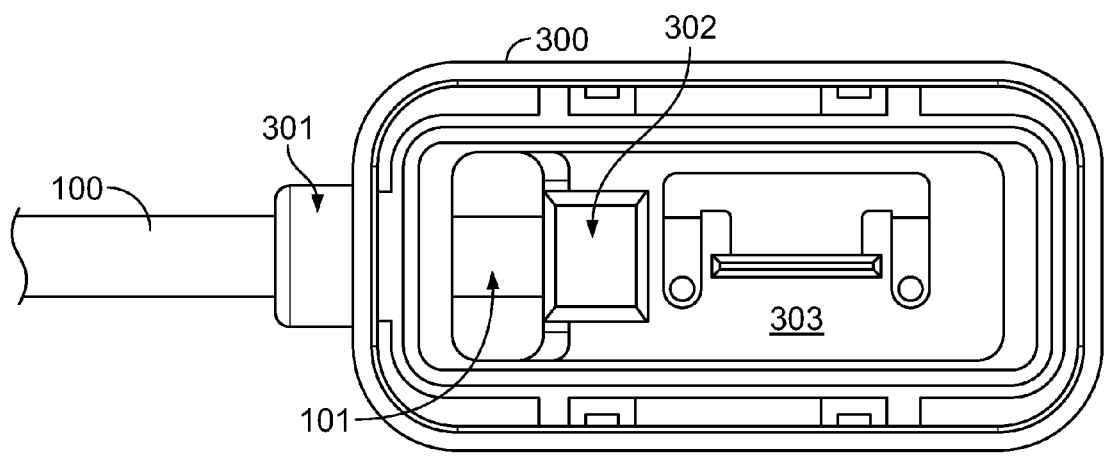
FIG. 3 is a top view of the solar photovoltaic junction box assembly according to the invention of FIG. 1.

A solar photovoltaic junction box assembly according to the invention, illustrated in perspective view in FIG. 1 and top view in FIG. 3, includes a housing having a housing body 300, a housing cover 400, a cable 100 inserted into the housing body 300 and joined to the housing body 300, and an electrical connector disposed in the housing body 300 and including at least a metal piece electrically connected to a solar cell and a terminal 200 electrically connected to the cable 100.

As is clear in FIG. 1 and FIG. 3, a chamber 303 for filling gel therein is formed in the housing body 300, and at least a portion of the chamber 303 is located between the terminal 200 and the joint of the cable 100 with the housing body 300. In this case, at least a portion 101 of the cable 100 within the housing body 300 is exposed and received in the chamber 303.

In the embodiment shown, the housing body 300 includes a first over-molded structure 301 and a second over-molded structure 302. The first over-molded structure 301 is formed at the joint of the cable 100 with an outer wall of the housing body 300 so that the periphery of the cable 100 is over-molded to the housing body 300, and the second over-molded structure 302 is formed at the electrical connection of a bare wire end of the cable 100 with the terminal 200 so that the electrical connection is over-molded to the terminal 200 of the electrical connector.

A portion of the chamber 303 is located between the first over-molded structure 301 and the second over-molded structure 302, which is clearly visible in section in FIGS. 1 and 3, wherein a portion 101 of the cable 100, which is not over-molded, is received in this portion of the camber 303. That is, a portion 101 of the cable 100 is located between the first over-molded structure 301 and the second over-molded structure 302 in the chamber 303.

The first over-molded structure 301 of the housing body 300 is applied to fasten the cable 100 to the housing body 300 and to seal the joint of the cable 100 with the housing body 300, and the second over-molded structure 302 is applied to fix and seal the electrical connection of the bare wire end of the cable 100 and the terminal 200 of the electrical connector. Accordingly, the first and second over-molded structures 301, 302 can further prevent the cable 100 from being loosened relative to the housing body 300 of the junction box, and can further prevent water from leaking into the housing body 300 of the junction box.

Figure 2:
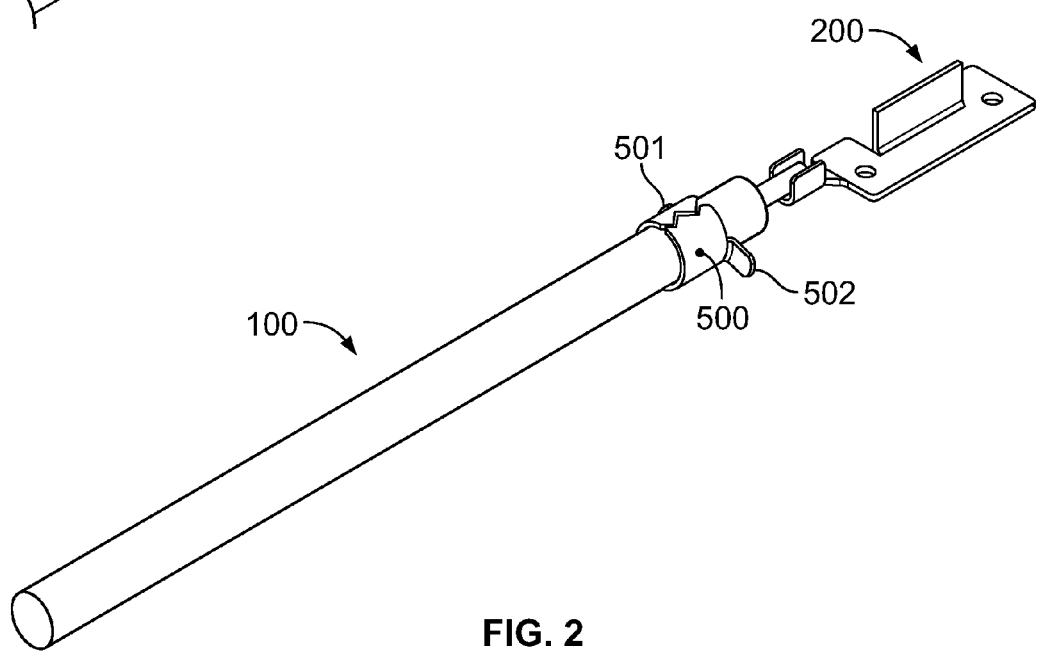
FIG. 2 is a perspective view of an electrical connection of a cable of another exemplary alternative embodiment to a terminal of an electrical connector in the junction box according to the invention.

Furthermore, the first and second over-molded structures 301, 302 are formed together with the housing body 300, and become a portion of the housing body 300. For example, the over-molding process for the present invention may be as follows. Firstly, as shown in FIG. 2, the bare wire end of the cable 100 and the terminal 200 of the electrical connector are connected; Next, the connected cable 100 and the electrical connector are placed in an over-molding die; Finally, plastic is filled in the die to over-mold the cable 100 and the terminal 200 to the housing body 300 forming the first and second over-molded structures 301, 302.

FIG. 2 shows another exemplary embodiment according to the invention. A ring clamp 500 is tightly enclosed on the cable 100. A pair of wings 501, 502 extend from the forward side of the ring clamp 500, then bend at substantially 90 degree outwardly and extend outwardly from the ring clamp 500 at the opposite sides of the cable 100.

Figure 4:
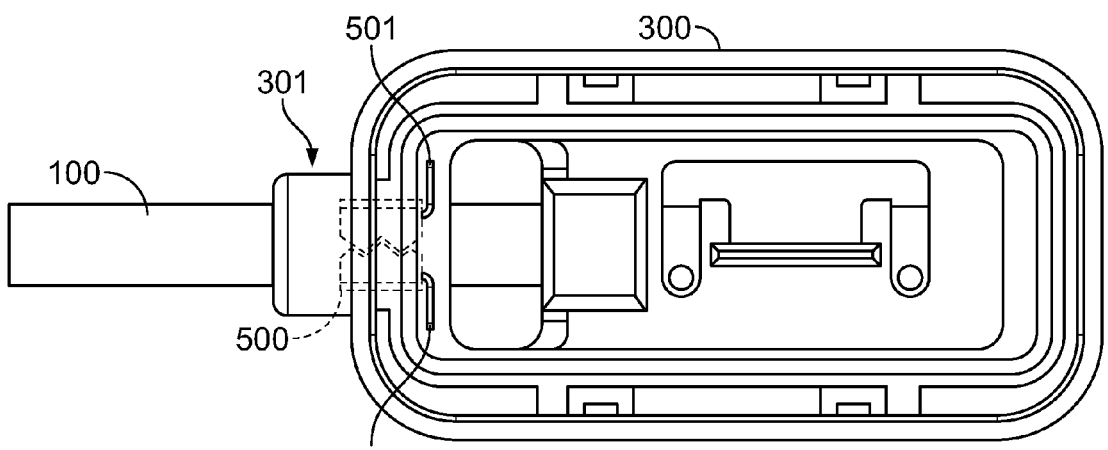
FIG. 4 is a top view of the solar photovoltaic junction box assembly according to the invention of FIG. 2 that shows a ring clamp embedded in an over-molded structure of the housing body of the junction box.

As shown in FIG. 4, the ring clamp 500 is embedded in the first over-molded structure 301 and the wings 501, 502 are applied to increase a joining force of the cable 100 to the housing body 300.

In this exemplary embodiment, during pulling or pushing the cable 100 relative to the housing body 300, the wings 501, 502 embedded in the first over-molded structure 301 can further effectively prevent the cable 100 from being loosened outwardly and inwardly relative to the housing body 300. The present invention is, however, not limited to the above configuration, the wings of the ring clamp may be modified to other different structures, such as with barbs on the ring clamp.

Figure 5:
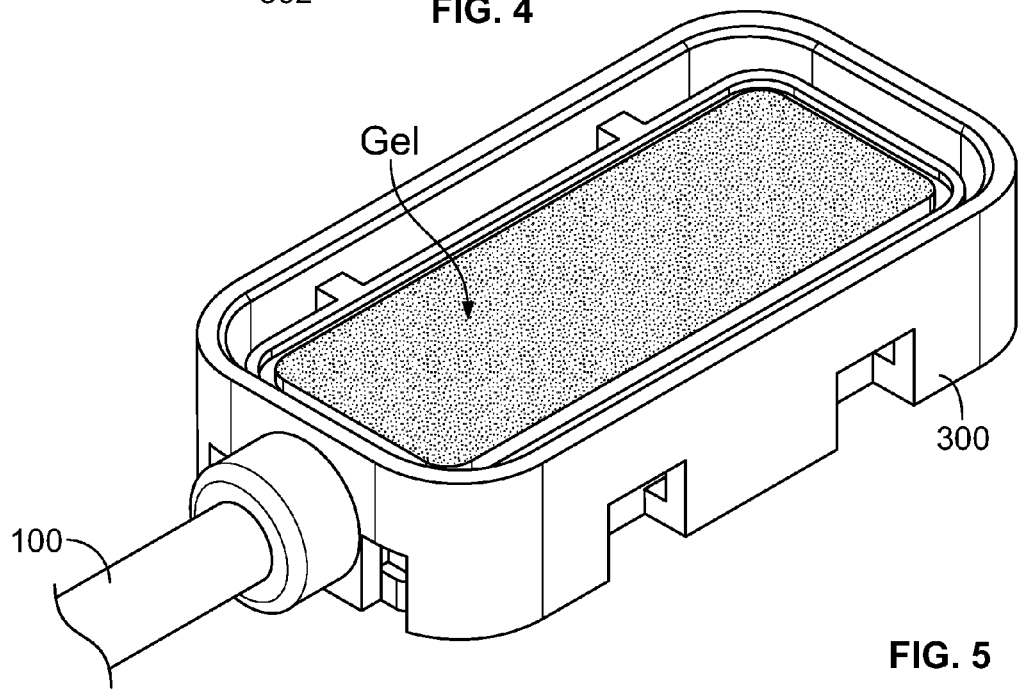
FIG. 5 is a perspective view of the solar photovoltaic junction box assembly after gel has been filled in a chamber from a side of the junction box assembly according to the invention.

As shown in FIG. 5, a gel, such as vegetable gum, silica gel or the like, is filled in the chamber 303, and the part 101 of the cable 100 in the chamber 303 is fixed to and sealed in the housing body 300 by the gel. The portion 101 of the cable 100 within the housing body 300 is sealed by the gel. Consequently, the entire configuration can prevent water from leaking into the housing body 300 through a gap that is possibly generated between the cable 100 and the housing body 300 due to thermal expansion or thermal contraction.

Figure 6:
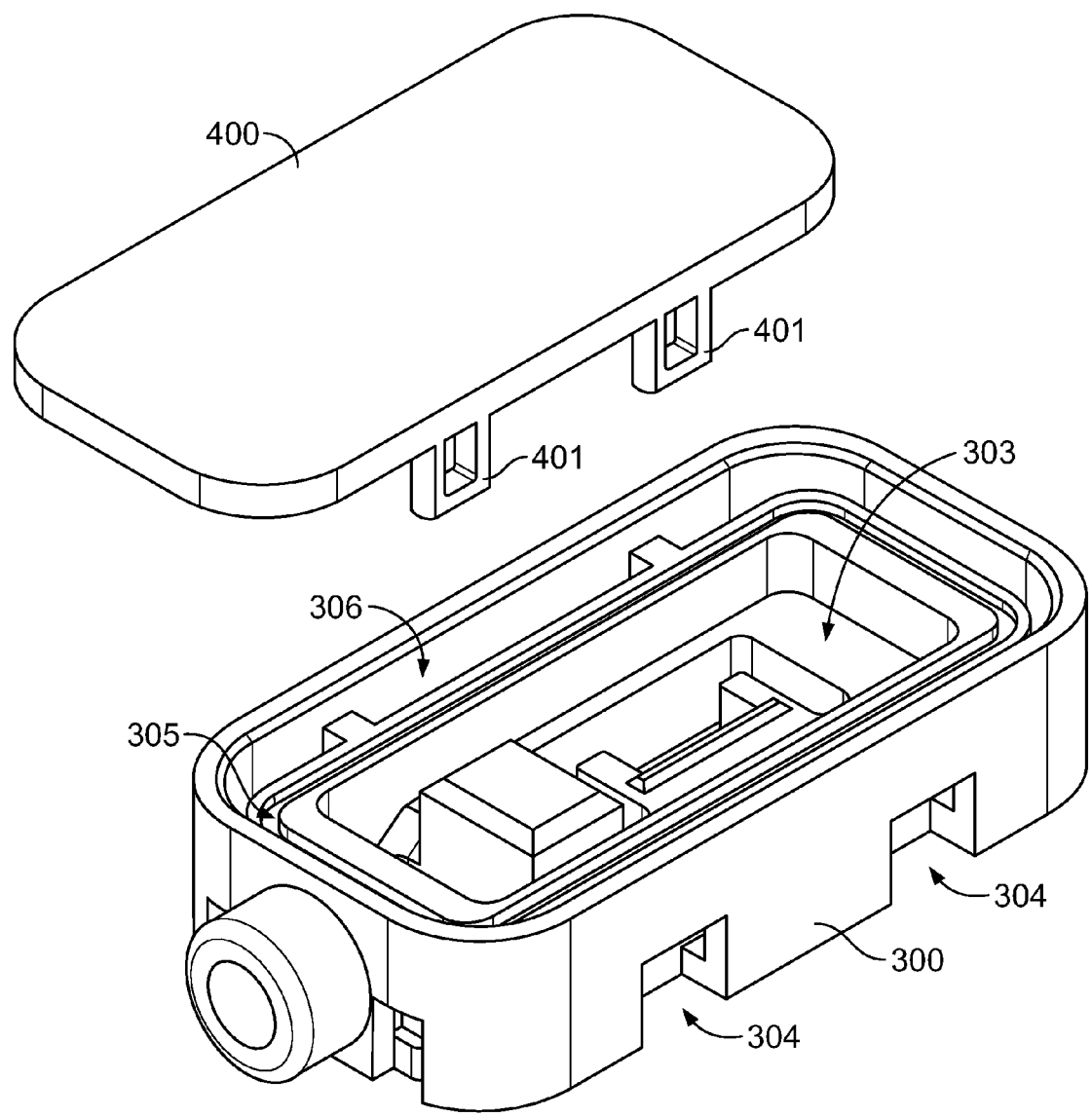
FIG. 6 is a perspective view of the housing body and the housing cover of the junction box from a side of the junction box according to the invention.

Referring to FIG. 6, the solar photovoltaic junction box assembly includes a ring recess 305 formed in the inside of the housing body 300 and around the chamber 303. Further, the solar photovoltaic junction box assembly includes a ring protrusion (not shown), corresponding to the ring recess 305, formed inside of the housing cover 400. In this case, when the housing cover 400 and the housing body 300 are fitted together, the ring protrusion is inserted into the ring recess 305 to seal an upper opening of the chamber 303. Alternatively, the ring recess may be formed inside of the housing cover 400, and the ring protrusion may be formed inside of the housing body 300. This combination of the configurations of the ring recess and the ring protrusion provides a solid seal for the camber 303.

Next, the solar photovoltaic junction box assembly further includes a ring channel 306 for draining water outside of the housing formed between an inner wall of the housing body 300 and the chamber 303 and around the inner wall of the housing body 300. The ring channel 306 includes at least one drain opening 304 at a bottom of the housing body. In this case, the water leaking into the housing can be drained out through the drain opening 304, instead of being accumulated in the housing. Therefore, it further improves the water-proof performance of the junction box.

FIG. 6 also shows the solar photovoltaic junction box assembly includes a first latch apparatus 401 formed on the housing cover 400, and a second latch apparatus (not shown) corresponding to the first latch apparatus 401 formed in the ring channel 306 of the housing body 300. Accordingly, when the housing cover 400 and the housing body 300 are fitted together, the first latch apparatus 401 and the second latch apparatus are locked together. For example, the first latch apparatus 401 may be formed as slits, and the second latch apparatus may be formed as hooks being able to be engaged with the slits.

Although several exemplary embodiments have been shown and described, it would be appreciated by those skilled in the art that various changes or modifications may be made in these embodiments without departing from the principles and the spirit of the disclosure, the scope of which is defined in the claims and their equivalents.

What is claimed is:
1. A solar photovoltaic junction box assembly, comprising:
a housing having a housing body and a housing cover;
a cable extending into the housing body and joined to the housing body;
a first over-molded structure formed at the joint of the cable with an outer wall of the housing body;

an electrical connector disposed in the housing body and including at least a metal piece electrically connected to a solar cell and a terminal electrically connected to the cable; and a second over-molded structure formed at an electrical connection of a bare wire end of the cable to the terminal and covering the electrical connector;

wherein a gel receiving chamber is formed between the terminal and a joint of the cable with the housing body.

2. The solar photovoltaic junction box assembly according to claim 1, wherein at least a part of the chamber is located between the first over-molded structure and the second over-molded structure.

3. The solar photovoltaic junction box assembly according to claim 1, further comprising a ring clamp tightly fixed on the cable.

4. The solar photovoltaic junction box assembly according to claim 3, wherein the ring clamp is embedded in the first over-molded structure and formed with a pair of wings extending from a forward side of the ring clamp, bent at substantially 90 degrees outwardly and extending outwardly from the ring clamp at opposite sides of the cable.

5. The solar photovoltaic junction box assembly according to claim 1, further comprising a ring recess formed inside of the housing body and around the chamber.

6. The solar photovoltaic junction box assembly according to claim 5, wherein a ring protrusion, corresponding to the ring recess, is formed inside of the housing cover.

7. The solar photovoltaic junction box assembly according to claim 6, wherein the ring protrusion is inserted into the ring recess to seal the chamber when the housing cover and the housing body are fitted together.

8. The solar photovoltaic junction box assembly according to claim 1, further comprising a ring channel formed between an inner wall of the housing body and the chamber and extending around the inner wall of the housing body.

9. The solar photovoltaic junction box assembly according to claim 8, wherein the ring channel is formed with at least one drain opening at a bottom of the housing body.

10. The solar photovoltaic junction box assembly according to claim 8, further comprising a first latch apparatus formed on the housing cover.

11. The solar photovoltaic junction box assembly according to claim 9, further comprising a second latch apparatus formed in the ring channel of the housing body.

12. The solar photovoltaic junction box assembly according to claim 11, wherein when the housing cover and the housing body are fitted together, the first latch apparatus and the second latch apparatus are latched together.

13. A solar photovoltaic junction box assembly, comprising:
a housing having a housing body and a housing cover;
a cable extending into the housing body and joined to the housing body;
a first over-molded structure formed at the joint of the cable with an outer wall of the housing body;
an electrical connector disposed in the housing body and including at least a metal piece electrically connected to a solar cell and a terminal electrically connected to the cable;
a gel receiving chamber formed between the terminal and a joint of the cable with the housing body;
a ring recess formed inside of the housing body and around the gel receiving chamber; and
a ring protrusion, corresponding to the ring recess, is formed inside of the housing cover.

14. The solar photovoltaic junction box assembly according to claim 13, wherein the ring protrusion is inserted into the ring recess to seal the chamber when the housing cover and the housing body are fitted together.

15. A solar photovoltaic junction box assembly, comprising:
a housing having a housing body and a housing cover;
a cable extending into the housing body and joined to the housing body;
a first over-molded structure formed at the joint of the cable with an outer wall of the housing body;
an electrical connector disposed in the housing body and including at least a metal piece electrically connected to a solar cell and a terminal electrically connected to the cable;
a gel receiving chamber formed between the terminal and a joint of the cable with the housing body; and
a ring channel formed between an inner wall of the housing body and the gel receiving chamber and extending around the inner wall of the housing body and having at least one drain opening at a bottom of the housing body.

16. The solar photovoltaic junction box assembly according to claim 15, further comprising a second latch apparatus formed in the ring channel of the housing body.

17. The solar photovoltaic junction box assembly according to claim 16, wherein when the housing cover and the housing body are fitted together, the first latch apparatus and the second latch apparatus are latched together.

* * * * *